(12) United States Patent
Heo

(10) Patent No.: US 12,354,974 B2
(45) Date of Patent: Jul. 8, 2025

(54) SEMICONDUCTOR PACKAGE INCLUDING PHOTO IMAGEABLE DIELECTRIC

(71) Applicant: SAMSUNG ELECTRONICS CO., LTD., Suwon-si (KR)

(72) Inventor: Yuseon Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 33 days.

(21) Appl. No.: 17/956,153

(22) Filed: Sep. 29, 2022

(65) Prior Publication Data

US 2023/0014900 A1    Jan. 19, 2023

Related U.S. Application Data

(63) Continuation of application No. 17/001,992, filed on Aug. 25, 2020, now Pat. No. 11,462,487.

(30) Foreign Application Priority Data

Mar. 12, 2020   (KR) .................... 10-2020-0030545

(51) Int. Cl.
*H01L 23/00*    (2006.01)
*H01L 21/48*    (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC .......... H01L 24/00; H01L 24/19; H01L 23/48
See application file for complete search history.

(56) References Cited

U.S. PATENT DOCUMENTS

| | | | |
|---|---|---|---|
| 6,599,828 B1 * | 7/2003 | Gardner | ........... H01L 21/76882 |
| | | | 438/646 |
| 6,699,350 B2 | 3/2004 | Bhatt et al. | |

(Continued)

FOREIGN PATENT DOCUMENTS

| | | |
|---|---|---|
| CN | 101480116 A | 7/2009 |
| KR | 10-2016-0037805 A | 4/2016 |

(Continued)

OTHER PUBLICATIONS

Office Action dated Jul. 21, 2024 for corresponding application No. KR 10-2020-0030545.

(Continued)

*Primary Examiner* — Kyoung Lee
*Assistant Examiner* — Christina A Sylvia
(74) *Attorney, Agent, or Firm* — Muir Patent Law, PLLC

(57) ABSTRACT

A semiconductor package includes a frame, a semiconductor chip, a through via, a connection pad, a lower redistribution layer on the bottom surfaces of the frame and the semiconductor chip, a connection terminal on the lower redistribution layer, an encapsulant covering the top surfaces of the frame and the semiconductor chip, and an upper redistribution layer on the encapsulant. The lower redistribution layer includes a lower insulating layer, a lower redistribution pattern, and an under-bump metal (UBM). The upper redistribution layer includes an upper insulating layer, an upper redistribution pattern, an upper via, and an upper connection pad. The lower insulating layer includes an inner insulating pattern surrounding the side surface of the UBM and an outer insulating pattern surrounding the side surface of the inner insulating pattern. The cyclization rate of the inner insulating pattern is higher than the cyclization rate of the outer insulating pattern.

19 Claims, 12 Drawing Sheets

(51) Int. Cl.
  *H01L 21/56* (2006.01)
  *H01L 21/683* (2006.01)
  *H01L 23/31* (2006.01)
  *H01L 23/538* (2006.01)
  *H01L 25/10* (2006.01)

(52) U.S. Cl.
  CPC ........ *H01L 21/565* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 25/105* (2013.01); *H01L 2221/68372* (2013.01); *H01L 2224/214* (2013.01); *H01L 2225/1035* (2013.01); *H01L 2225/1041* (2013.01); *H01L 2225/1058* (2013.01); *H01L 2924/3512* (2013.01)

(56) References Cited

U.S. PATENT DOCUMENTS

| | | | |
|---|---|---|---|
| 6,830,875 B2 | 12/2004 | Fuerniss et al. | |
| 8,097,955 B2 | 1/2012 | Zimmermann et al. | |
| 8,980,691 B2 | 3/2015 | Lin | |
| 9,059,249 B2 | 6/2015 | Darnon et al. | |
| 9,406,531 B1 | 8/2016 | Camacho et al. | |
| 9,472,481 B2 | 10/2016 | Lin | |
| 2010/0044845 A1 | 2/2010 | Funaya et al. | |
| 2011/0017498 A1 | 1/2011 | Lauffer et al. | |
| 2011/0294066 A1* | 12/2011 | Hasegawa | G03F 7/0233 430/270.1 |
| 2013/0207278 A1 | 8/2013 | Brock et al. | |
| 2014/0252573 A1 | 9/2014 | Lin et al. | |
| 2015/0115467 A1 | 4/2015 | Park et al. | |
| 2016/0093572 A1* | 3/2016 | Chen | H01L 23/5389 438/126 |
| 2017/0287839 A1* | 10/2017 | Lee | H01L 23/5386 |
| 2018/0066107 A1 | 3/2018 | Shoji et al. | |
| 2018/0145061 A1 | 5/2018 | Jeong et al. | |
| 2018/0294299 A1* | 10/2018 | Baek | G06V 40/1318 |
| 2018/0356727 A1* | 12/2018 | Shuto | G03F 7/0226 |
| 2019/0131241 A1 | 5/2019 | Jeng et al. | |
| 2019/0148267 A1 | 5/2019 | Chen et al. | |

FOREIGN PATENT DOCUMENTS

| | | |
|---|---|---|
| KR | 10-2017-0112372 A | 10/2017 |
| KR | 10-2019-0029460 A | 3/2019 |
| TW | 201642028 A | 12/2016 |

OTHER PUBLICATIONS

Office Action dated Mar. 18, 2023 for corresponding application No. TW 109138200.

* cited by examiner

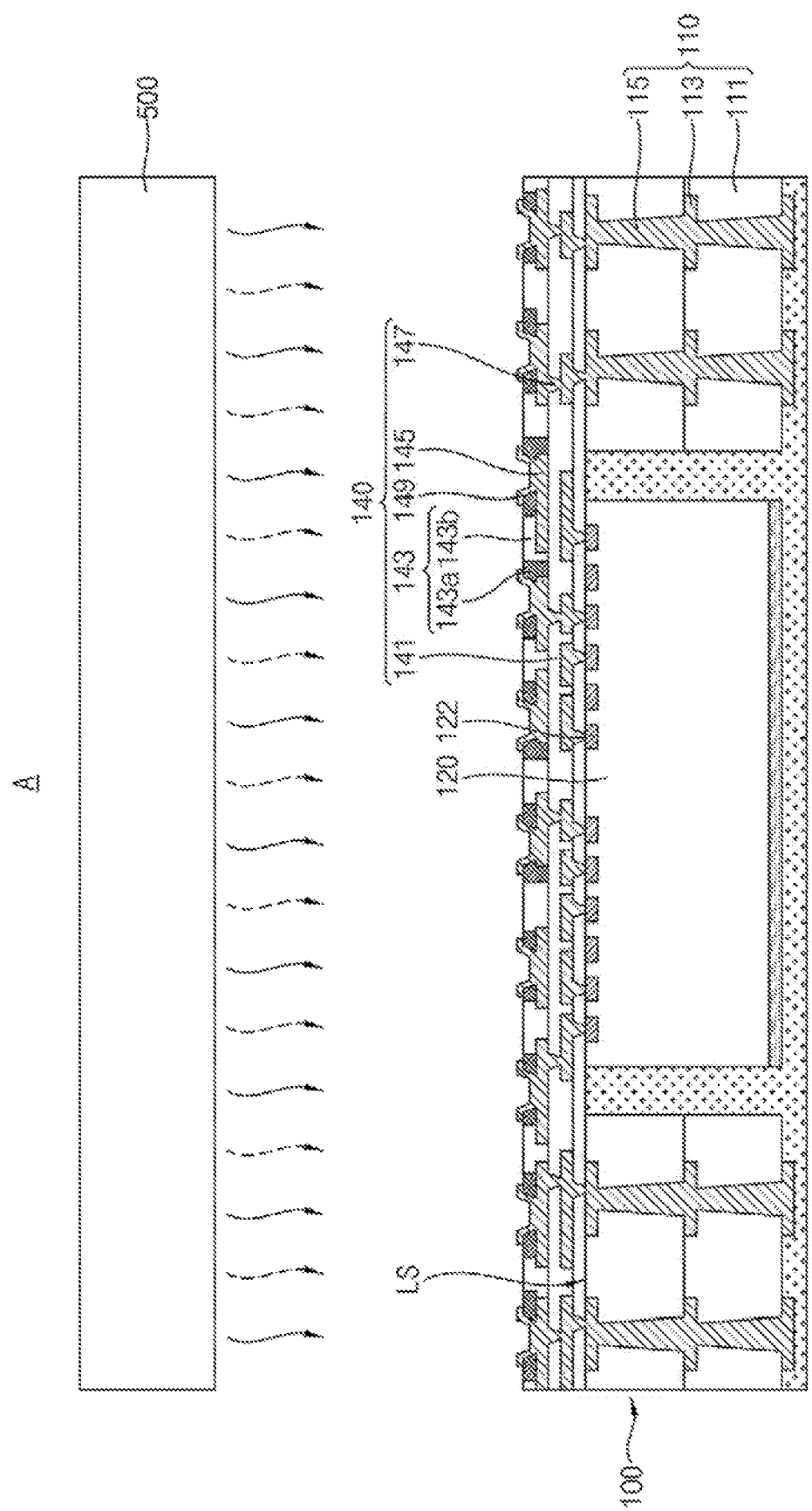

FIG. 11A

| 260°C_slot#1 | | | | |
|---|---|---|---|---|
| No | REF.(1600) | Cure(1535) | PBO CONVERSION RATE | CONVERSION RATE(%) | AVERAGE |
| 1 | 14.888030 | 1.654111 | 0.736313 | 73.631 | |
| 2 | 16.859384 | 1.876790 | 0.735799 | 73.580 | 73.35 |
| 3 | 15.332140 | 1.754511 | 0.728410 | 72.841 | |

| 260°C_slot#2 | | | | |
|---|---|---|---|---|
| No | REF.(1600) | Cure(1535) | PBO CONVERSION RATE | CONVERSION RATE(%) | AVERAGE |
| 1 | 17.398234 | 1.980277 | 0.729865 | 72.986 | |
| 2 | 17.251489 | 1.933390 | 0.734017 | 73.402 | 73.22 |
| 3 | 17.326612 | 1.952124 | 0.732604 | 73.260 | |

| 280°C_slot#1 | | | | |
|---|---|---|---|---|
| No | REF.(1600) | Cure(1535) | PBO CONVERSION RATE | CONVERSION RATE(%) | AVERAGE |
| 1 | 18.530545 | 0.566750 | 0.927412 | 92.741 | |
| 2 | 18.325120 | 0.556712 | 0.927898 | 92.790 | 92.75 |
| 3 | 18.322200 | 0.561212 | 0.927304 | 92.730 | |

| 280°C_slot#2 | | | | |
|---|---|---|---|---|
| No | REF.(1600) | Cure(1535) | PBO CONVERSION RATE | CONVERSION RATE(%) | AVERAGE |
| 1 | 20.735178 | 0.645655 | 0.926098 | 92.610 | |
| 2 | 20.875411 | 0.652214 | 0.925849 | 92.585 | 92.61 |
| 3 | 20.998721 | 0.651274 | 0.926391 | 92.639 | |

FIG. 11B

| 300°C_slot#1 | | | | | |
|---|---|---|---|---|---|
| No | REF.(1600) | Cure(1535) | PBO CONVERSION RATE | CONVERSION RATE(%) | AVERAGE |
| 1 | 18.232412 | 0.000000 | 1.000000 | 100.000 | |
| 2 | 17.220120 | 0.000000 | 1.000000 | 100.000 | 100.00 |
| 3 | 18.366521 | 0.000000 | 1.000000 | 100.000 | |

| 300°C_slot#2 | | | | | |
|---|---|---|---|---|---|
| No | REF.(1600) | Cure(1535) | PBO CONVERSION RATE | CONVERSION RATE(%) | AVERAGE |
| 1 | 17.370990 | 0.000000 | 1.000000 | 100.000 | |
| 2 | 18.986658 | 0.000000 | 1.000000 | 100.000 | 100.00 |
| 3 | 18.655110 | 0.000000 | 1.000000 | 100.000 | |

| 320°C_slot#1 | | | | | |
|---|---|---|---|---|---|
| No | REF.(1600) | Cure(1535) | PBO CONVERSION RATE | CONVERSION RATE(%) | AVERAGE |
| 1 | 18.837989 | 0.000000 | 1.000000 | 100.000 | |
| 2 | 17.988541 | 0.000000 | 1.000000 | 100.000 | 100.00 |
| 3 | 18.665210 | 0.000000 | 1.000000 | 100.000 | |

| 320°C_slot#2 | | | | | |
|---|---|---|---|---|---|
| No | REF.(1600) | Cure(1535) | PBO CONVERSION RATE | CONVERSION RATE(%) | AVERAGE |
| 1 | 14.674966 | 0.000000 | 1.000000 | 100.000 | |
| 2 | 15.698141 | 0.000000 | 1.000000 | 100.000 | 100.00 |
| 3 | 15.366541 | 0.000000 | 1.000000 | 100.000 | |

SEMICONDUCTOR PACKAGE INCLUDING PHOTO IMAGEABLE DIELECTRIC

CROSS-REFERENCE TO RELATED APPLICATIONS

This application is a continuation of pending U.S. application Ser. No. 17/001,992, filed on Aug. 25, 2020, which is incorporated by reference herein in its entirety.
Korean Patent Application No. 10-2020-0030545, filed on Mar. 12, 2020, in the Korean Intellectual Property Office, and entitled: "Semiconductor Package Including Photo Imageable Dielectric and Manufacturing Method Thereof," is incorporated by reference herein in its entirety.

BACKGROUND

1. Field

Embodiments relate to a semiconductor package including a photo imageable dielectric (PID) and a manufacturing method thereof.

2. Description of the Related Art

In a panel level package (PLP) structure or a wafer level package (WLP) structure, a portion of an outermost insulating layer that is adjacent to an under-bump metal (UBM) may crack due to a low degree of curing thereof. This may cause deterioration in the reliability of a semiconductor package.

SUMMARY

Embodiments are directed to a semiconductor package, including a frame including therein a cavity, a semiconductor chip in the cavity, a through via penetrating the frame, a connection pad on the frame and connected to the through via, a lower redistribution layer on the bottom surface of the frame and the bottom surface of the semiconductor chip, a connection terminal on the lower redistribution layer, an encapsulant filling the cavity and covering the top surface of the frame and the top surface of the semiconductor chip, and an upper redistribution layer on the encapsulant. The lower redistribution layer may include a lower insulating layer, a lower redistribution pattern on the lower insulating layer, and an under-bump metal (UBM) between the lower redistribution layer and the connection terminal. The upper redistribution layer may include an upper insulating layer, an upper redistribution pattern on the upper insulating layer, and an upper via and an upper connection pad connected to the upper redistribution pattern. The lower insulating layer may include an inner insulating pattern surrounding a side surface of the UBM, and an outer insulating pattern surrounding a side surface of the inner insulating pattern. The cyclization rate of the inner insulating pattern may be higher than the cyclization rate of the outer insulating pattern.

A semiconductor package in accordance with an example embodiment may include a semiconductor chip, a mold layer surrounding a side surface of the semiconductor chip, a lower redistribution layer under the semiconductor chip and the mold layer, an upper redistribution layer on the semiconductor chip and the mold layer, and a through-mold via (TMV) penetrating the mold layer. The lower redistribution layer may include a lower insulating layer, a lower redistribution pattern on the lower insulating layer, and a lower via and a UBM connected to the lower redistribution pattern. The lower insulating layer may include an inner insulating pattern surrounding a side surface of the UBM, and an outer insulating pattern surrounding a side surface of the inner insulating pattern. The mechanical strength of the inner insulating pattern may be greater than the mechanical strength of the outer insulating pattern.

A semiconductor package in accordance with an example embodiment may include a semiconductor chip, a mold layer surrounding a side surface of the semiconductor chip, a lower redistribution layer under the semiconductor chip and the mold layer, an upper redistribution layer on the semiconductor chip and the mold layer, a TMV penetrating the mold layer and connected to the lower redistribution layer and the upper redistribution layer, and a solder bump between the semiconductor chip and the lower redistribution layer. The lower redistribution layer may include a lower insulating layer covering the bottom surface of the mold layer, a lower redistribution pattern on the lower insulating layer, and a lower via and a UBM connected to the lower redistribution pattern. The lower insulating layer may include an inner insulating pattern surrounding a side surface of the UBM, and an outer insulating pattern surrounding a side surface of the inner insulating pattern. The inner insulating pattern may include polybenzoxazole (PBO), and the outer insulating pattern may include polybenzoxazole (PBO) and polyhydroxyamide (PHA).

A semiconductor package in accordance with an example embodiment may include a lower semiconductor package, and an upper semiconductor package on the lower semiconductor package. The lower semiconductor package may include a semiconductor chip, a mold layer surrounding a side surface of the semiconductor chip, a lower redistribution layer under the semiconductor chip and the mold layer, an upper redistribution layer on the semiconductor chip and the mold layer, and a TMV penetrating the mold layer and connected to the lower redistribution layer and the upper redistribution layer. The upper semiconductor package may include a connection terminal connected to the upper redistribution layer. The lower redistribution layer may include a lower insulating layer on the mold layer, a lower via penetrating the lower insulating layer, a lower redistribution pattern connected to the lower via, and a UBM connected to the lower redistribution pattern. The lower insulating layer may include an outermost insulating layer disposed such that the bottom surface thereof is exposed, and an insulating layer on the outermost insulating layer. The outermost insulating layer may include an inner insulating pattern surrounding an outer surface of the UBM, and an outer insulating pattern surrounding the inner insulating pattern. The outermost insulating layer and the insulating layer may include different materials from each other, and the inner insulating pattern and the outer insulating pattern may include different materials from each other.

A method of manufacturing a semiconductor package in accordance with an example embodiment may include forming a cavity in a frame, placing a semiconductor chip in the cavity, forming an encapsulant covering the frame and the semiconductor chip, forming a lower redistribution layer on the bottom surfaces of the frame and the semiconductor chip, and forming an upper redistribution layer covering the top surface of the encapsulant. The forming the lower redistribution layer may include forming a lower insulating layer, forming a via penetrating the lower insulating layer, forming a lower redistribution pattern on the lower insulating layer, forming an outermost insulating layer so as to cover the lower redistribution pattern and to be disposed such that the top surface thereof is exposed, removing a portion of the outermost insulating layer to form an opening, and forming a UBM in the opening. The forming the lower insulating layer may include forming an inner insulating pattern surrounding a side surface of the UBM, and forming an outer insulating pattern surrounding a side surface of the inner insulating pattern. The forming the inner insulating pattern may include selectively heating the outermost insulating layer to form the inner insulating pattern. The inner insulating pattern may include PID having a cyclization rate of 100%.

BRIEF DESCRIPTION OF THE DRAWINGS

Features will become apparent to those of skill in the art by describing in detail example embodiments with reference to the attached drawings in which:

FIGS. 6 to 10 are cross-sectional views schematically showing stages in a method of forming a semiconductor package according to an example embodiment.

FIGS. 11A and 11B are comparison tables showing PBO conversion rates at respective curing temperature conditions using IR equipment.

DETAILED DESCRIPTION

Figure 1:
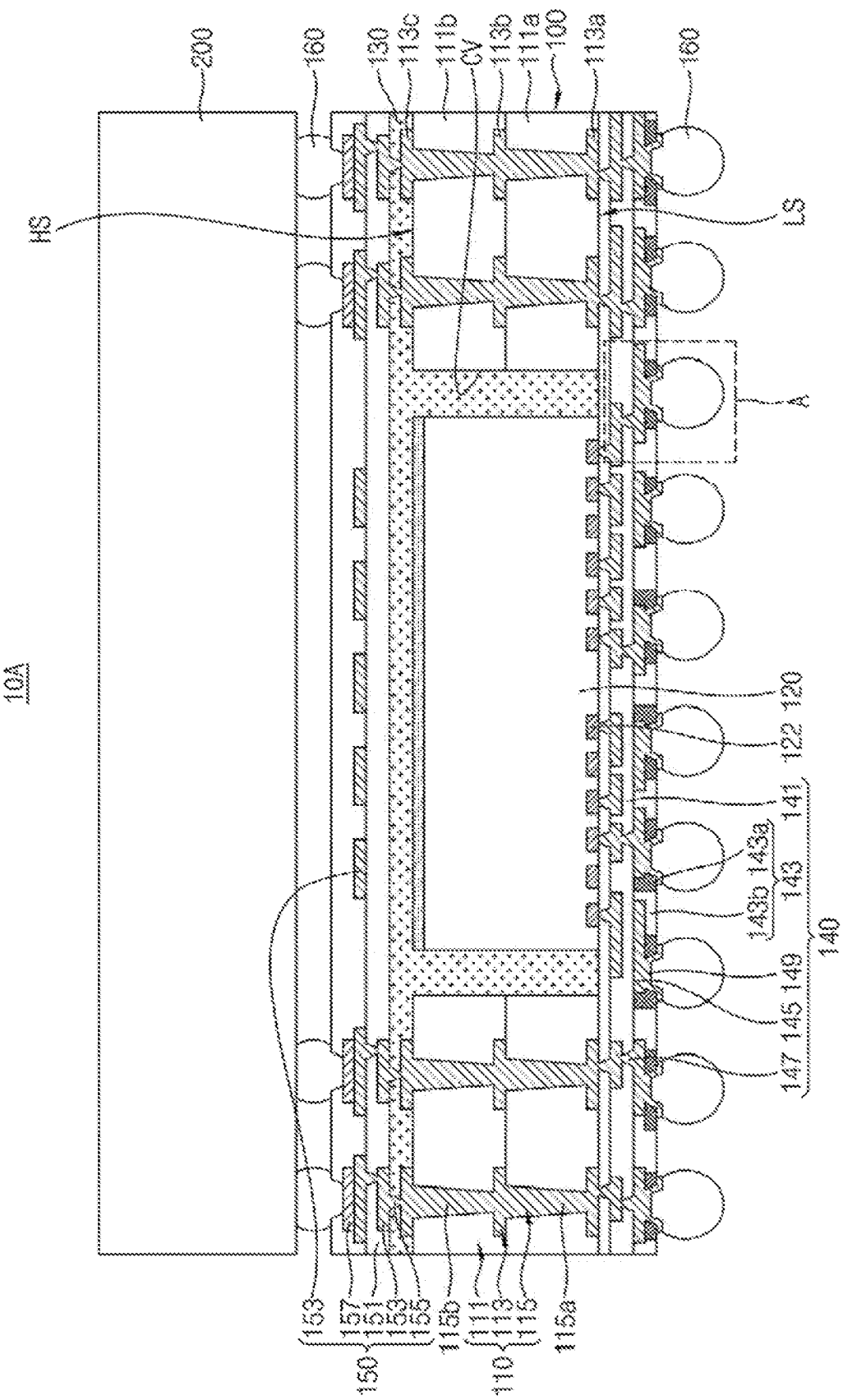
FIG. 1 is a longitudinal sectional view of a semiconductor package 10A according to an example embodiment.

FIG. 1 is a longitudinal sectional view of a semiconductor package 10A according to an example embodiment.

Referring to FIG. 1, the semiconductor package 10A may include a lower semiconductor package 100 and an upper semiconductor package 200. The semiconductor package 10A may be, for example, a package-on-package (PoP)-type semiconductor package in which the upper semiconductor package 200 is mounted on the lower semiconductor package 100. The lower semiconductor package 100 may be, for example, a fan-out panel level package (FOPLP)-type semiconductor package.

The lower semiconductor package 100 may include a frame 110, a semiconductor chip 120, an encapsulant 130, a lower redistribution layer 140, an upper redistribution layer 150, and a connection terminal 160.

The frame 110 may include a core 111, a connection pad 113, and a through via 115. The frame 110 may be, for example, a printed circuit board. The core 111 may have a cavity CV formed in the central portion thereof, and may be a plate having a square rim shape in a top view.

Each of the core 111, the connection pad 113, and the through via 115 may be formed in a multi-layered structure. In an example embodiment, the core 111 may include a first core 111a, which is disposed such that the bottom surface thereof is in contact with the lower redistribution layer 140, and a second core 111b disposed on the first core 111a. The connection pad 113 may include a first connection pad 113a, which is in contact with the lower redistribution layer 140 and is embedded in the first core 111a, a second connection pad 113b, which is disposed on the first core 111a, and a third connection pad 113c, which is disposed on the second core 111b. The through via 115 may include a first through via 115a, which penetrates the first core 111a and electrically connects the first connection pad 113a to the second connection pad 113b, and a second through via 115b, which penetrates the second core 111b and electrically connects the second connection pad 113b to the third connection pad 113c.

The core 111 may include, for example, at least one of a phenol resin, an epoxy resin, or a polyimide. The core 111 may include, for example, at least one of a flame retardant 4 (FR4) substrate, a tetrafunctional epoxy, a polyphenylene ether, a bismaleimide triazine (BT), an epoxy/polyphenylene oxide, Thermount, a cyanate ester, a polyimide, or a liquid crystal polymer.

The connection pad 113 may include, for example, at least one of an electrolytically deposited (ED) copper foil, a rolled-annealed (RA) copper foil, a stainless steel foil, an aluminum foil, an ultra-thin copper foil, a sputtered copper, or a copper alloy.

The through via 115 may include, for example, at least one of copper, nickel, a stainless steel, or beryllium copper.

The semiconductor chip 120 may be disposed in the cavity CV in the core 111. A horizontal cross-sectional area of the cavity CV may be larger than a horizontal cross-sectional area of the semiconductor chip 120. The semiconductor chip 120 may be disposed so as to be spaced apart from the inner surface of the core 111 in the cavity CV in the core 111.

A chip pad 122 may be disposed under the semiconductor chip 120. The bottom surface of the chip pad 122 may be coplanar with the bottom surface of the semiconductor chip 120. The bottom surface of the chip pad 122 may be coplanar with the bottom surface of the connection pad 113. In an example embodiment, the chip pad 122 may be disposed on the bottom surface of the semiconductor chip 120, and may have a structure protruding from the bottom surface of the semiconductor chip 120.

The semiconductor chip 120 may be, for example, a central processing unit (CPU), a microprocessor unit (MPU), a graphics processing unit (GPU), or an application processor (AP). In an example embodiment, the semiconductor chip 120 may be a controller semiconductor chip for controlling the upper semiconductor package 200 to be described later.

The encapsulant 130 may be disposed in the cavity CV in the core 111, and may be disposed on the frame 110 and the semiconductor chip 120. The encapsulant 130 may cover the top surface of the frame 110 and the top surface of the semiconductor chip 120. The encapsulant 130 may completely fill the space between the inner surface of the core 111 and the side surface of the semiconductor chip 120 in the cavity CV in the core 111, and may be in contact with the lower redistribution layer 140 and the upper redistribution layer 150. The encapsulant 130 may include an insulating material such as Ajinomoto build-up film (ABF). In another implementation, the encapsulant 130 may include a photo imageable encapsulant (PIE).

The lower redistribution layer 140 may be disposed on the bottom surface LS of the frame 110 and the bottom surface of the semiconductor chip 120, and the upper redistribution layer 150 may be disposed on the frame 110. The upper redistribution layer 150 may be disposed on the encapsulant 130.

The lower redistribution layer 140 may include lower insulating layers 141 and 143, a lower redistribution pattern 145 and a lower via 147, and an under-bump metal (UBM) 149. The lower insulating layers 141 and 143 may be stacked on the bottom surface of the frame 110. The lower insulating layers 141 and 143 may include, for example, an outermost insulating layer 143 having an exposed bottom surface and an insulating layer 141 disposed on the outermost insulating layer 143. Thus, the insulating layer 141 may cover the bottom surface of the frame 110, and the outermost insulating layer 143 may form the bottom surface of the lower semiconductor package 100.

The lower insulating layers 141 and 143 may include a different material from the other one thereof, for example, the insulating layer 141 and the outermost insulating layer 143 may include different materials from each other. For example, the insulating layer 141 may include Ajinomoto build-up film (ABF), epoxy, or polyimide. In another implementation, the insulating layer 141 may be a resin impregnated together with an inorganic filler in a core material such as a glass fiber (or a glass cloth or a glass fabric), for example, prepreg, FR-4, bismaleimide triazine (BT), or solder resist. The outermost insulating layer 143 may be a photo imageable dielectric (PID).

A plurality of lower redistribution patterns 145 and lower vias 147 may be disposed in a multi-layered structure on the bottom surface of the frame 110. The lower redistribution pattern 145 may be disposed on the lower insulating layer 141, and the UBM 149 may be disposed on the lower redistribution pattern 145. The UBM 149 may be disposed between the lower redistribution layer 140 and the connection terminal 160. The lower redistribution pattern 145 and the UBM 149 may include, for example, copper, nickel, stainless steel, or a copper alloy such as beryllium copper.

The upper redistribution layer 150 may be disposed on the top surface of the frame 110. The upper redistribution layer 150 may include an upper insulating layer 151, an upper redistribution pattern 153, an upper via 155, and an upper connection pad 157. The upper insulating layer 151 may be disposed on the encapsulant 130. The upper insulating layer 151 may include an ABF and/or a solder resist layer.

The upper redistribution pattern 153 may be disposed on the encapsulant 130. The upper redistribution pattern 153 may be disposed on the upper insulating layer 151. The upper via 155 may be connected to the upper redistribution pattern 153. The upper via 155 may penetrate the encapsulant 130 covering the top surface HS of the core 111, and may connect the connection pad 113 to the upper redistribution pattern 153. The upper connection pad 157 may be disposed on the upper redistribution pattern 153. The upper via 155 and the upper redistribution pattern 153 may include copper. The upper connection pad 157 may include nickel and/or aluminum. The upper redistribution layer 150 may include the same materials as the lower redistribution layer 140.

The connection terminal 160 may be disposed on the lower redistribution layer 140. The connection terminal 160 may be in contact with the UBM 149 of the lower redistribution layer 140. The connection terminal 160 may be disposed on the lower redistribution pattern 145 of the upper redistribution layer 150. The connection terminal 160 may be in contact with the upper connection pad 157. For example, the connection terminal 160 may be a solder ball or a bump. The connection terminal 160 may electrically connect the lower semiconductor package 100 to the upper semiconductor package 200.

The upper semiconductor package 200 may be flip-chip bonded onto the lower semiconductor package 100. The upper semiconductor package 200 may be electrically connected to the semiconductor chip 120 by the connection terminal 160 and the upper redistribution layer 150. The upper semiconductor package 200 may include, for example, a memory semiconductor chip. For example, the memory semiconductor chip may be a volatile memory semiconductor chip such as DRAM or SRAM, or may be a nonvolatile memory semiconductor chip such as PRAM, MRAM, FeRAM, or RRAM.

Figure 2:
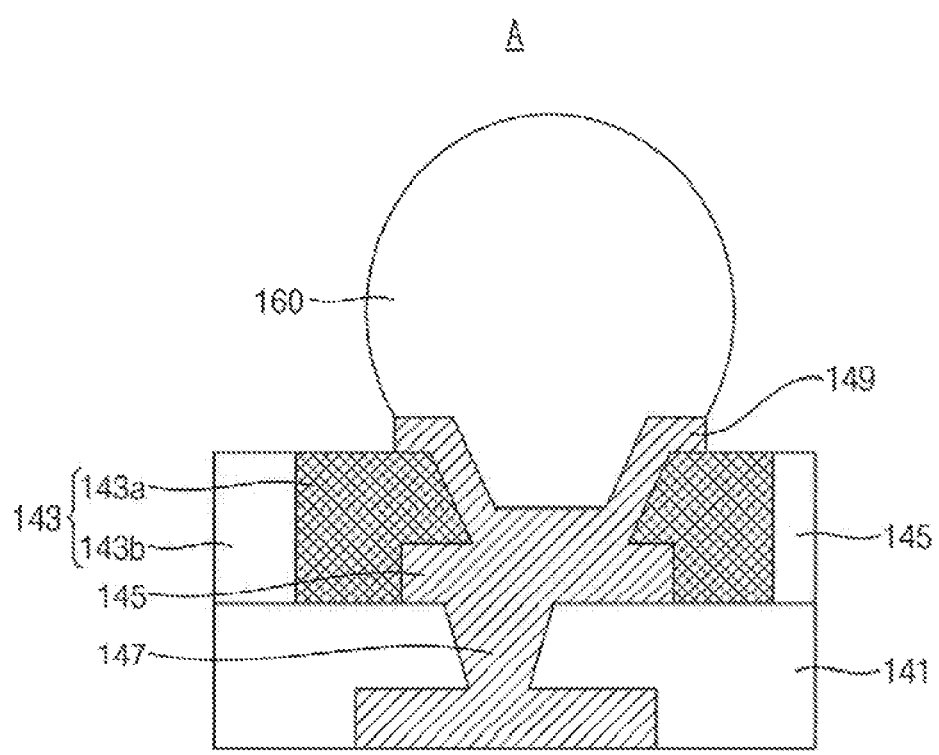
FIG. 2 is an enlarged view of portion A of the semiconductor package 10A shown in FIG. 1 according to an example embodiment.
Figure 3:
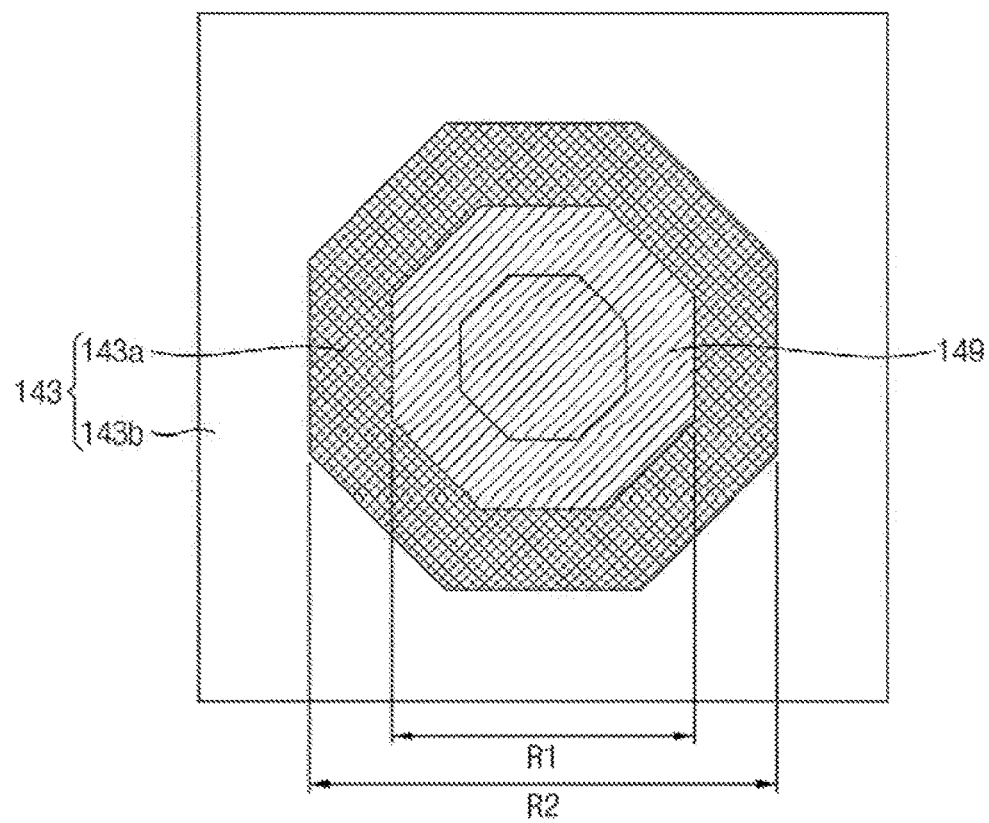
FIGS. 3 and 4 are schematic top views of portion A of the semiconductor package 10A shown in FIG. 1 according to example embodiments.
Figure 4:
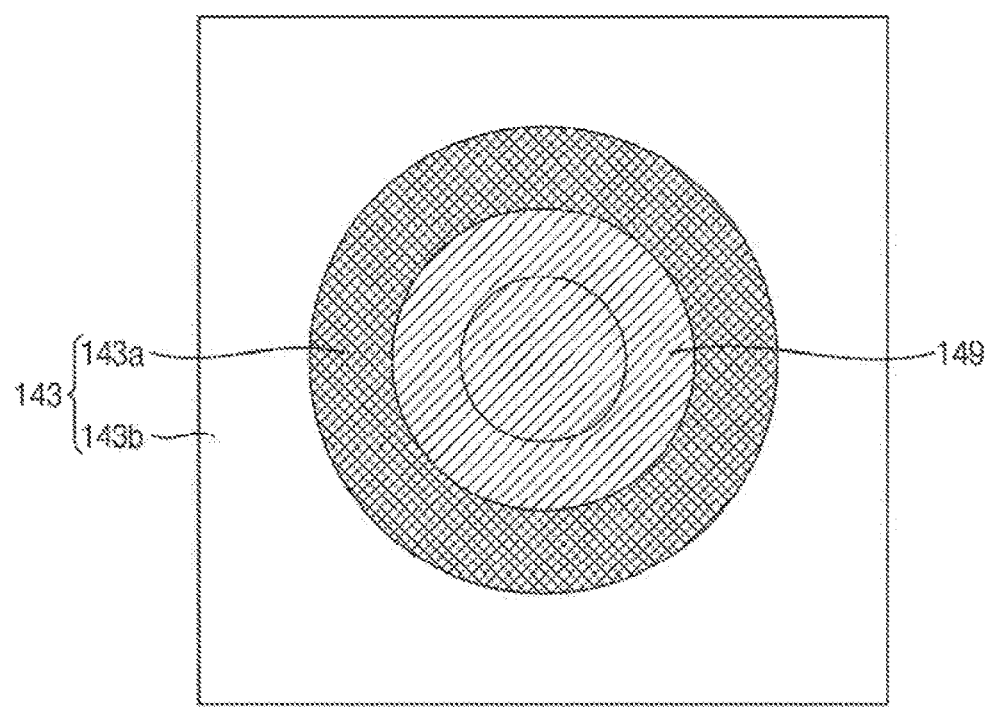

FIG. 2 is an enlarged inverted view of portion A of the semiconductor package 10A shown in FIG. 1 according to an example embodiment. FIGS. 3 and 4 are schematic top views of portion A of the semiconductor package 10A shown in FIG. 1 according to example embodiments.

Referring to FIG. 2, the outermost insulating layer 143 may include an inner insulating pattern 143a and an outer insulating pattern 143b. The inner insulating pattern 143a may cover the outer surface of the UBM 149. The inner insulating pattern 143a may cover the side and top surfaces of the lower redistribution pattern 145. The bottom surface of the inner insulating pattern 143a may be in contact with the top surface of the lower insulating layer 141. The outer insulating pattern 143b may cover the outer surface of the inner insulating pattern 143a. The outer insulating pattern 143b may be spaced apart from the lower redistribution pattern 145 and the UBM 149.

The inner insulating pattern 143a and the outer insulating pattern 143b may include a photo imageable dielectric (PID). The inner insulating pattern 143a and the outer insulating pattern 143b may include different materials from each other. For example, the inner insulating pattern 143a may include polybenzoxazole (PBO) resin or polyimide (PI) resin. The outer insulating pattern 143b may include polyhydroxyamide (PHA) and polybenzoxazole (PBO). In another implementation, the outer insulating pattern 143b may include polyamic acid (PAA) and polyimide (PI). In an example embodiment, when the inner insulating pattern 143a includes polybenzoxazole (PBO) and the outer insulating pattern 143b includes polybenzoxazole (PBO) and polyhydroxyamide (PHA), the proportion of polybenzoxazole (PBO) in the inner insulating pattern 143a may be different from the proportion of polybenzoxazole (PBO) in the outer insulating pattern 143b. The proportion of polybenzoxazole (PBO) in the inner insulating pattern 143a may be greater than the proportion of polybenzoxazole (PBO) in the outer insulating pattern 143b.

In an example embodiment, the cyclization rate of the inner insulating pattern 143a may be higher than the cyclization rate of the outer insulating pattern 143b (the cyclization rate is the proportion of the copolymer in which cyclization occurs). For example, the cyclization rate of the inner insulating pattern 143a may be 100%, and the cyclization rate of the outer insulating pattern 143b may be lower. For example, polyhydroxyamide (PHA), which is a precursor of polybenzoxazole (PBO), may be subjected to cyclization through a chemical or thermal method, and may be converted into polybenzoxazole (PBO). Polyamic acid (PAA), which is a precursor of polyimide (PI), may be subjected to cyclization through a chemical or thermal method, and may be converted into polyimide (PI). In this case, the proportion of polyhydroxyamide (PHA) that is converted into polybenzoxazole (PBO) and the proportion of polyamic acid (PAA) that is converted into polyimide (PI) are the cyclization rates.

Referring to FIG. 3, the inner insulating pattern 143a may surround the UBM 149. In an example embodiment, the inner insulating pattern 143a may have a shape corresponding to the outer surface of the UBM 149 in a top view. For example, the inner insulating pattern 143a may have a polygonal rim shape in a top view. The diameter R2 of the inner insulating pattern 143a may be 1.1 to 1.5 times the diameter R1 of the UBM 149.

Referring to FIG. 4, the UBM 149 may have a circular shape in a top view. The inner insulating pattern 143a may have a circular rim shape.

Figure 5:
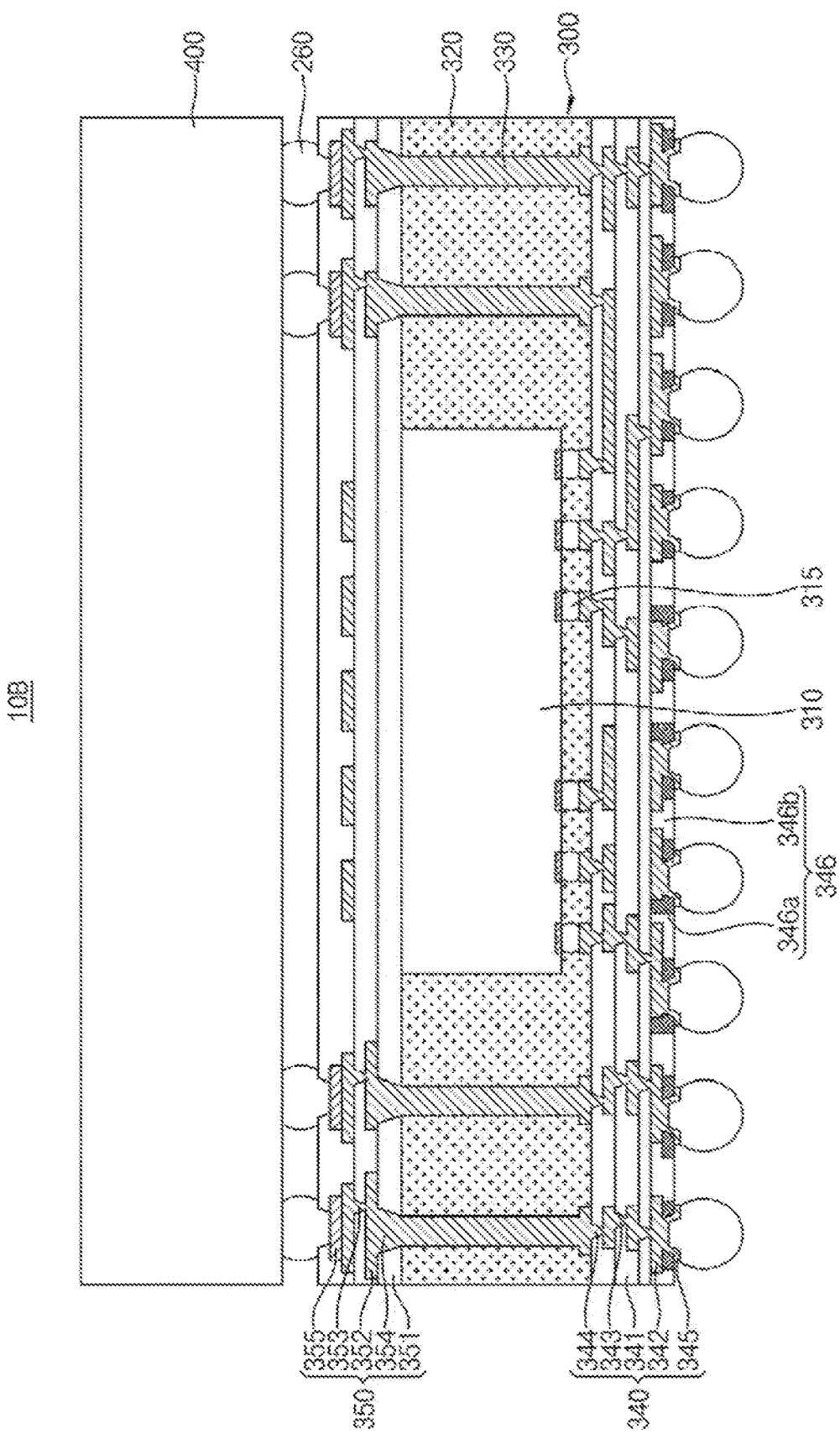
FIG. 5 is a longitudinal sectional view of a semiconductor package 10B according to another example embodiment.

FIG. 5 is a longitudinal sectional view of a semiconductor package 10B according to another example embodiment.

Referring to FIG. 5, the semiconductor package 10B may be a wafer level package. For example, the semiconductor package 10B may be a fan-out wafer level package. In another implementation, the semiconductor package 10B may be a fan-in wafer level package. In an example embodiment, the wafer level package may be a package-on-package (PoP)-type semiconductor package in which an upper semiconductor package 400 is mounted on a lower semiconductor package 300.

The semiconductor package 10B may include a semiconductor chip 310, a mold layer 320, a through-mold via (TMV) 330, a lower redistribution layer 340, an upper redistribution layer 350, a connection terminal 260, and an upper semiconductor package 400.

The mold layer 320 may surround the side surface of the semiconductor chip 310. The mold layer 320 may include, for example, an epoxy molding compound (EMC). The lower redistribution layer 340 may be disposed under the semiconductor chip 310 and the mold layer 320, and the upper redistribution layer 350 may be disposed on the semiconductor chip 310 and the mold layer 320.

The TMV 330 may penetrate the mold layer 320. The TMV 330 may be disposed so as to be spaced apart from the side surface of the semiconductor chip 310. The TMV 330 may electrically connect the upper redistribution layer 350 to the lower redistribution layer 340. The semiconductor chip 310 may be provided in a plural number. When a plurality of semiconductor chips 310 is provided, the TMV 330 may also be disposed between the semiconductor chips 310.

The lower redistribution layer 340 may include lower insulating layers 341 and 346, a lower redistribution pattern 342, a lower via 343, a lower pad 344, and a UBM 345. A solder bump 315 may be disposed between the lower redistribution layer 340 and the semiconductor chip 310. The solder bump 315 may electrically connect the lower redistribution layer 340 to the semiconductor chip 310.

Among the lower insulating layers 341 and 346, an outermost insulating layer 346, which has an exposed bottom surface, may include an inner insulating pattern 346a and an outer insulating pattern 346b, like the outermost insulating layer 143 described above with reference to FIGS. 1 to 4. In an example embodiment, the mechanical strength of the inner insulating pattern 346a may be greater than the mechanical strength of the outer insulating pattern 346b. For example, the mechanical strength (e.g. elongation or toughness) of the inner insulating pattern 346a may be two or more times the mechanical strength of the outer insulating pattern 346b.

The upper redistribution layer 350 may include an upper insulating layer 351, an upper redistribution pattern 352, an upper via 353, an upper pad 354, and an upper connection pad 355. The upper insulating layer 351 may cover the top surfaces of the mold layer 320 and the semiconductor chip 310. The upper redistribution pattern 352 may be disposed on the upper insulating layer 351, and the upper via 353 may be disposed on the upper redistribution pattern 352. The upper pad 354 may be connected to the upper end of the TMV 330, and may electrically connect the upper redistribution pattern 352 to the TMV 330. The upper connection pad 355 may be disposed between the upper redistribution pattern 352 and the connection terminal 260.

FIGS. 6 to 10 are cross-sectional views schematically showing stages a method of forming a semiconductor package according to an example embodiment.

Figure 6:
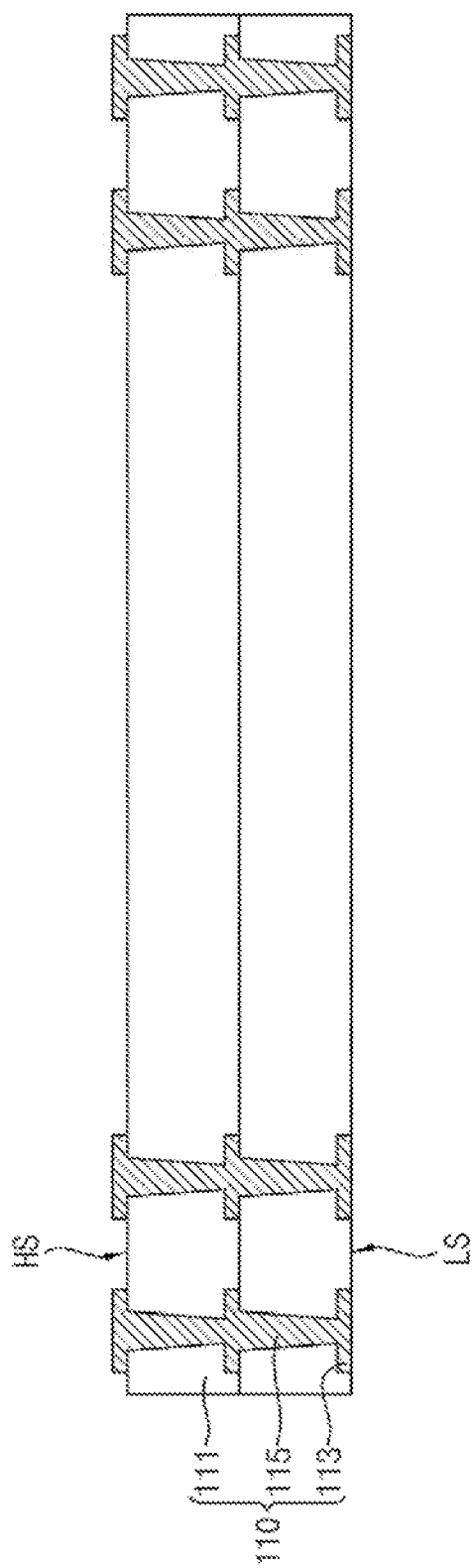

FIG. 6 shows the cross-section of a portion of a frame 110 that may be used as a unit package. The size of the frame 110 may be set to various sizes that are suitable for mass production. Depending on the method, a frame 110 having a large size may be prepared, and a plurality of semiconductor packages may be manufactured using the same, and may be divided into individual packages through a sawing process.

Referring to FIG. 6, the method may include providing a frame 110 including a core 111, a connection pad 113, and a through via 115.

Figure 7:
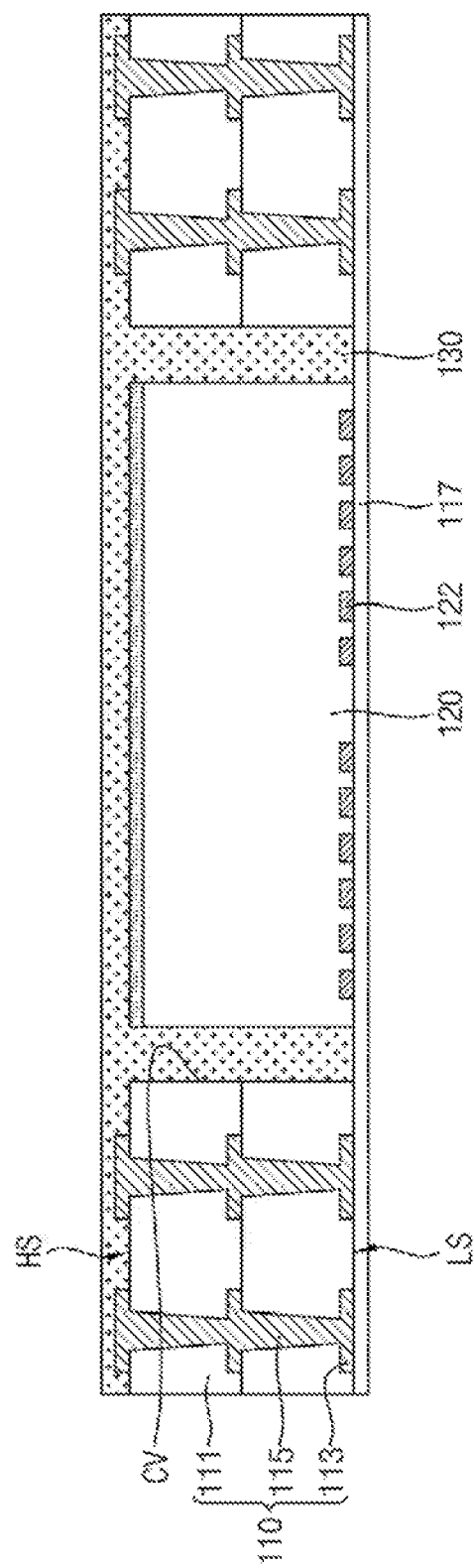

Referring to FIG. 7, the method may include forming a cavity CV through the frame 110, attaching an adhesive film 117 to the bottom surface of the frame 110, placing a semiconductor chip 120 in the cavity CV, and forming an encapsulant 130 in the space between the core 111 and the semiconductor chip 120.

For example, the adhesive film 117 may be an Ajinomoto build-up film (ABF), and may function as a support film for supporting the semiconductor chip 120. The adhesive film 117 may cover the bottom surface of the connection pad 113 and/or the bottom surface of the core 111.

The semiconductor chip 120 may be disposed in the cavity CV in the core 111, and may be attached onto the adhesive film 117. The semiconductor chip 120 may be disposed so as to be spaced apart from the inner surface of the cavity CV such that a space may be provided between the inner surface of the core 111 and the side surface of the semiconductor chip 120.

A chip pad 122 may be on the bottom surface of the semiconductor chip 120, and the semiconductor chip 120 may be disposed in a face-down arrangement such that the chip pad 122 is oriented downwards. The bottom surface of the semiconductor chip 120 and the bottom surface of the chip pad 122 may be completely covered by the adhesive film 117.

The encapsulant 130 may completely fill the space between the inner surface of the core 111 and the side surface of the semiconductor chip 120 in the cavity CV in the core 111, and may be in contact with the top surface of the adhesive film 117. The encapsulant 130 may serve to fix the semiconductor chip 120 to minimize movement of the semiconductor chip 120 during subsequent processing.

Figure 8:
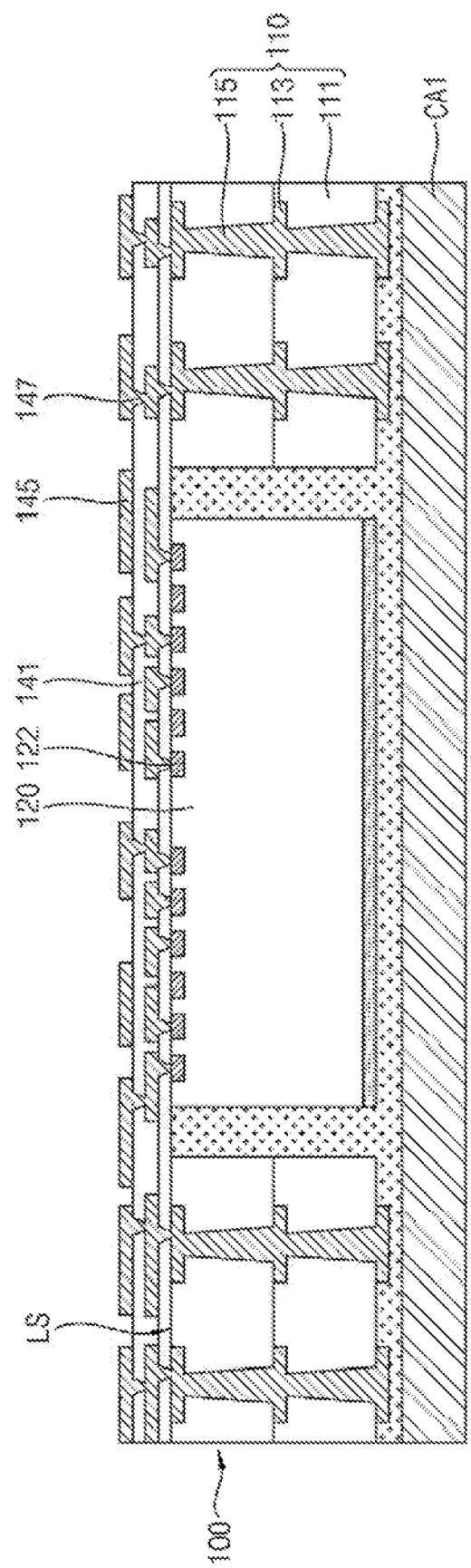

Referring to FIG. 8, and as explained in further detail below, the method may include attaching a first carrier substrate CA1 onto the encapsulant 130, removing the adhesive film 117, and forming a lower redistribution layer 140 on the bottom surface of the frame 110. The forming the lower redistribution layer 140 may include forming a lower insulating layer 141, a lower redistribution pattern 145, a lower via 147, and a UBM 149 (see FIG. 9).

In detail, the intermediate product having the first carrier substrate CA attached thereto may be turned over such that the first carrier substrate CA1 is oriented downwards and the chip pad 122 of the semiconductor chip 120 is oriented upwards. Subsequently, the lower insulating layer 141 may be formed so as to cover the bottom surface of the semiconductor chip 120, the bottom surface of the frame 110, and the bottom surface LS of the encapsulant 130. The lower insulating layer 141 may be, for example, an ABF. The lower via 147 may be formed so as to penetrate the lower insulating layer 141, and the lower redistribution pattern 145 may be formed on the lower insulating layer 141 and the lower via 147. The lower insulating layer 141, the lower redistribution pattern 145, and the lower via 147 may be formed in a multi-layered structure.

The lower redistribution pattern 145 and the lower via 147 may be formed, for example, through a plating method. For example, the plating method may include an electroplating method, an electroless plating method, and/or an immersion plating method. When the lower redistribution pattern 145 and the lower via 147 are formed through the plating method, before the lower insulating layer 141 is formed, a seed layer may be formed in advance to cover the connection pad 113 of the frame 110 and the chip pad 122 of the semiconductor chip 120.

Figure 9:
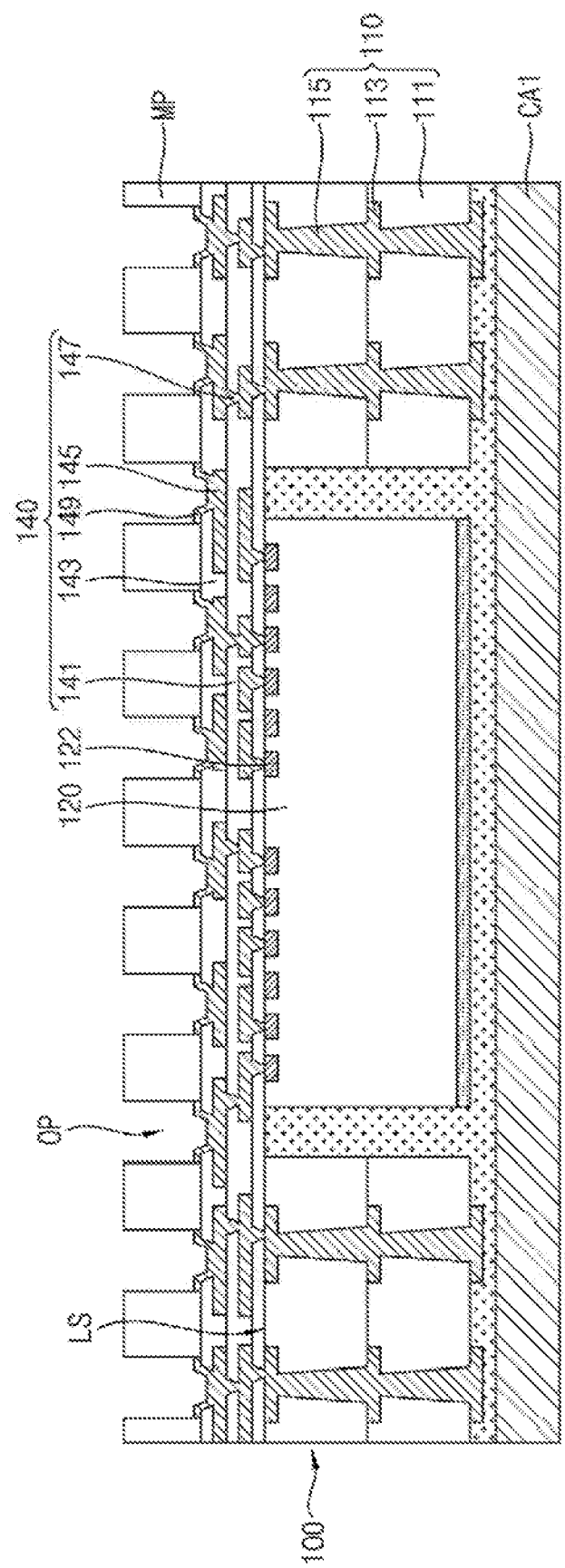

Referring to FIG. 9, the method may include forming an outermost insulating layer 143 and forming a UBM 149.

Resin not including a filler may be coated and cured to form the outermost insulating layer 143. The outermost insulating layer 143 may be formed in a manner such that the coated resin is primarily heated to 230° C. or lower in order to prevent the insulating layer 141 from being deformed by thermal stress applied thereto. The outermost insulating layer 143 may cover the exposed top surface of the lower insulating layer 141 and the exposed surface of the lower redistribution pattern 145. For example, the outermost insulating layer 143 may include a photo imageable dielectric (PID). A portion of the outermost insulating layer 143 may be removed through an exposure process to form an opening. A portion of the lower redistribution pattern 145 may be exposed through the opening.

Mask patterns MP may be formed on the lower redistribution pattern 145. For example, the mask patterns MP may be photoresists. A mask opening OP formed between the mask patterns MP may have a larger horizontal area than the opening. Subsequently, the UBM 149 may be formed in the mask opening OP. For example, the UBM 149 may be formed through the aforementioned plating method. Subsequently, the mask patterns MP and the carrier substrate CA1 may be removed.

Referring to FIG. 10, the method may include forming an inner insulating pattern 143a and an outer insulating pattern 143b.

The UBM 149 may be selectively heated, and the portion of the outermost insulating layer 143 that is located in the vicinity of the UBM 149 may be secondarily heated, thereby forming the inner insulating pattern 143a. The UBM 149 may be heated to 300° C. or higher. The UBM 149 may include a material having high thermal conductivity, such as copper. Thus, when sufficiently heated to 300° C. or higher, heat may be conducted to the outermost insulating layer 143. Accordingly, the portion of the outermost insulating layer 143 that is adjacent to the UBM 149 may be further cured to form the inner insulating pattern 143a. The outermost insulating layer 143 may include a material having relatively low thermal conductivity, such as a photo imageable dielectric (PID). Thus, the portion thereof that is adjacent to the UBM 149 may alone be selectively cured, and heat may be conducted only to the outermost insulating layer 143, without being conducted to the lower insulating layer 141.

When the outermost insulating layer 143 is secondarily heated to 300° C. or higher, the cyclization rate of the photo imageable dielectric (PID) may increase, thus leading to improvement of mechanical/thermal properties of the inner insulating pattern 143a. Accordingly, the occurrence of cracking in the vicinity of the UBM 149 may be prevented, and thus the reliability of the package and the chemical resistance thereof in a flux process may be improved.

For example, when the outermost insulating layer 143 is a photo imageable dielectric (PID) including polyhydroxyamide (PHA), the polyhydroxyamide (PHA) may be converted into polybenzoxazole (PBO) through thermal cyclization. Accordingly, the inner insulating pattern may be composed of polybenzoxazole (PBO), and the outer insulating pattern may include polyhydroxyamide (PHA) and polybenzoxazole (PBO).

As another example, when the outermost insulating layer 143 is a photo imageable dielectric (PID) including polyamic acid (PAA), the polyamic acid (PAA) may be converted into polyimide (PI) through thermal cyclization. Accordingly, the inner insulating pattern 143a may be composed of polyimide (PI), and the outer insulating pattern 143b may include polyimide (PI) and polyamic acid (PAA).

The UBM 149 may be selectively heated using, for example, rapid thermal process (RTP) equipment 500. For example, the rapid thermal process (RTP) equipment 500 may be near-infrared (IR) equipment. The equipment 500 may selectively heat only the UBM 149 by adjusting the wavelength range of radiation using the phenomenon in which the radiation absorptivity of copper (Cu) varies depending on the optical properties of the surface of Cu. For example, the wavelength range of radiation for selectively heating the UBM 149 composed of copper may be 0.78 μm to 2.5 μm. Subsequently, a connection terminal 160 may be formed on the UBM 149.

FIGS. 11A and 11B are comparison tables showing PBO conversion rates at respective curing temperature conditions using IR equipment. The conversion rate (i.e. the cyclization rate) of a photo imageable dielectric (PID) at each temperature may be calculated by comparing the FT-IR peak before heating with the FT-IR peak after heating. For example, the PBO conversion rate may be calculated using the ratio of the reduced C=O & C—NH amide (after heating) to the aromatic ring C—C of the photo imageable dielectric (PID) (before heating).

Referring to FIGS. 11A and 11B, it can be appreciated that the polybenzoxazole (PBO) conversion rate (i.e. the cyclization rate) is 100% when polyhydroxyamide (PHA) is heated to 300° C. or higher and cured. However, it can be appreciated that the polybenzoxazole (PBO) conversion rate is less than 100% when polyhydroxyamide (PHA) is heated to a temperature lower than 300° C. and cured.

Figure 12:
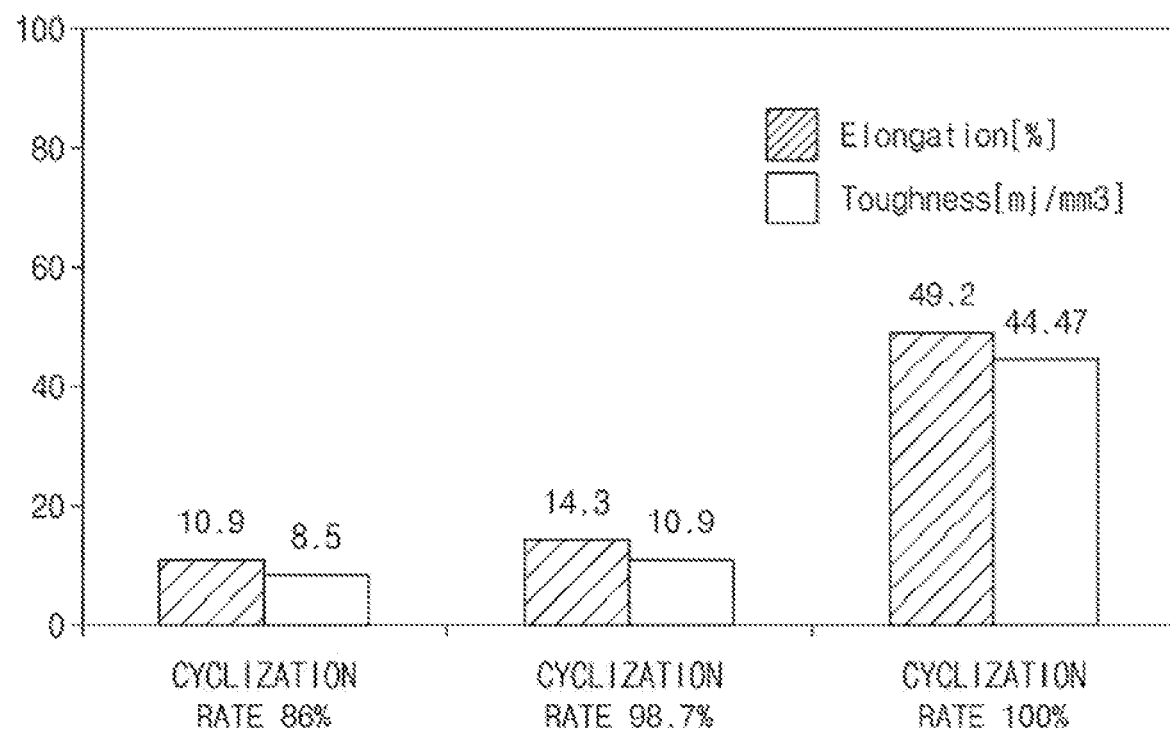
FIG. 12 is a graph showing the mechanical properties in accordance with PBO cyclization rates.

FIG. 12 is a graph showing the mechanical properties in accordance with PBO cyclization rates.

Referring to FIG. 12, it can be appreciated that the mechanical strength (e.g. elongation or toughness) of a photo imageable dielectric (PID) having a cyclization rate of 100% is improved two times or more as compared with the mechanical strength of a photo imageable dielectric (PID) having a cyclization rate of 98.7%.

According to an example embodiment, the inner insulating pattern 143a includes a photo imageable dielectric (PID) having a cyclization rate of 100%. Thus, the thermal and mechanical properties thereof may be enhanced, and the occurrence of cracking thereof in the vicinity of the UBM 149 may be reduced. As a result, the reliability of the semiconductor package may be improved.

By way of summation and review, heating an insulating layer to a high temperature may be employed to increase the degree of curing of the outermost insulating layer. In this case, thermal stress may be applied to a layer disposed under the outermost insulating layer. The outermost insulating layer and a layer disposed thereunder may include different materials, and thus may have different thermal expansion coefficients from each other. Thus, the thermal stress may cause cracking to occur between the outermost insulating layer and the layer disposed thereunder.

As described above, embodiments may provide a semiconductor package in which a photo imageable dielectric (PID) having enhanced physical properties is provided in the vicinity of an under-bump metal (UBM), which may reduce or prevent the occurrence of cracking.

As described above, a semiconductor package may include an insulating layer in the vicinity of a UBM that has improved mechanical and thermal properties. Thus, the occurrence of cracking thereof may be prevented, and the reliability of the semiconductor package and the chemical resistance thereof in a flux process may be improved.

Embodiments may provide a method of manufacturing a semiconductor package for selectively heating a PID in the vicinity of a UBM to a high temperature while preventing the application of thermal stress to a layer disposed under the PID.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a lower redistribution layer including a plurality of lower insulating layers, a plurality of lower redistribution patterns disposed in the plurality of lower insulating layers, and an under-bump metal (UBM) extended in an outermost lower insulating layer among the plurality of lower insulating layers and connected to an outermost lower redistribution pattern among the plurality of lower redistribution patterns;
a semiconductor chip disposed on the lower redistribution layer and electrically connected to the plurality of lower redistribution patterns;
a mold layer surrounding the semiconductor chip on the lower redistribution layer;
an upper redistribution layer disposed on the mold layer and including at least one upper redistribution pattern;
a through-mold via (TMV) penetrating the mold layer and connected to the plurality of lower redistribution patterns and the at least one upper redistribution pattern; and
a connection terminal disposed on the UBM,
wherein the outermost lower insulating layer includes a first compound that is a precursor compound and a second compound that is cyclized from the first compound, and has a first portion including the second compound relative to the first compound in a first proportion and a second portion including the second compound relative to the first compound in a second proportion less than the first proportion, and
wherein a diameter of the first portion is between 1.1 and 1.5 times a diameter of the UBM.

2. The semiconductor package as claimed in claim 1, wherein the first compound includes a polyhydroxyamide or a polyamic acid.

3. The semiconductor package as claimed in claim 1, wherein the second compound includes a polybenzoxazole or a polyimide.

4. The semiconductor package as claimed in claim 1, wherein the first proportion of the second compound relative to the first compound is 100%.

5. The semiconductor package as claimed in claim 1, wherein the outermost lower insulating layer is a photo imageable dielectric.

6. The semiconductor package as claimed in claim 1, wherein the first portion surrounds a side surface of the UBM.

7. The semiconductor package as claimed in claim 1, wherein the second portion surrounds a side surface of the first portion.

8. A semiconductor package, comprising:
a lower redistribution layer including a plurality of lower insulating layers, a plurality of lower redistribution patterns disposed in the plurality of lower insulating layers, and an under-bump metal (UBM) extended in an outermost lower insulating layer among the plurality of lower insulating layers and connected to an outermost lower redistribution pattern among the plurality of lower redistribution patterns;
a semiconductor chip disposed on the lower redistribution layer and electrically connected to the plurality of lower redistribution patterns; and
a mold layer surrounding the semiconductor chip on the lower redistribution layer;
wherein the outermost lower insulating layer has an outer portion surrounding the UBM, and an inner portion between the UBM and the outer portion and having an elongation and a toughness greater than that of the outer portion, and
wherein a diameter of the inner portion is between 1.1 and 1.5 times a diameter of the UBM.

9. The semiconductor package as claimed in claim 8, wherein:
the outer portion includes a first compound that is a precursor compound and a second compound that is cyclized from the first compound, and
the inner portion includes the second compound.

10. The semiconductor package as claimed in claim 9, wherein a cyclization rate of the inner portion is higher than a cyclization rate of the outer portion.

11. The semiconductor package as claimed in claim 8, wherein the inner portion is a photo imageable dielectric having a cyclization rate of 100%.

12. The semiconductor package as claimed in claim 8, wherein the outer portion includes a photo imageable dielectric having a cyclization rate lower than 100%.

13. The semiconductor package as claimed in claim 8, wherein:
the inner portion includes a photo imageable dielectric including a polybenzoxazole, and
the outer portion includes a photo imageable dielectric including a polyhydroxyamide and a polybenzoxazole.

14. The semiconductor package as claimed in claim 8, wherein:
the inner portion includes a photo imageable dielectric including a polyimide, and
the outer portion includes a photo imageable dielectric including a polyamic acid and a polyimide.

15. The semiconductor package as claimed in claim 8, wherein the mechanical strength of the inner portion is at least two times as strong as the outer portion.

16. A semiconductor package, comprising:
- a lower redistribution layer including a plurality of lower insulating layers, a plurality of lower redistribution patterns disposed in the plurality of lower insulating layers, and an under-bump metal (UBM) extended in an outermost lower insulating layer among the plurality of lower insulating layers and connected to an outermost lower redistribution pattern among the plurality of lower redistribution patterns;
- a semiconductor chip disposed on the lower redistribution layer and electrically connected to the plurality of lower redistribution patterns; and
- a mold layer surrounding the semiconductor chip on the lower redistribution layer, wherein:
- the outermost lower insulating layer has a first portion surrounding a side surface of the UBM, and a second portion surrounding a side surface of the first portion, and
- on a plane, an edge of the UBM is defined as a circular rim shape by the side surface of the UBM, and an edge of the first portion is defined as a shape corresponding to the edge of the UBM by the side surface of the first portion;
- wherein the first portion of the outermost lower insulating layer has an elongation and a toughness greater than that of the second portion of the outermost lower insulating layer, and
- wherein a diameter of the between 1.1 and 1.5 times a diameter of the UBM.

17. The semiconductor package as claimed in claim 16, wherein:
- the first portion includes a photo imageable dielectric including a polybenzoxazole, and
- the second portion includes a photo imageable dielectric including a polyhydroxyamide and a polybenzoxazole.

18. The semiconductor package as claimed in claim 16, wherein: the first portion includes a photo imageable dielectric including a polyimide, and the second portion includes a photo imageable dielectric including a polyamic acid and a polyimide.

19. The semiconductor package as claimed in claim 16, wherein a cyclization rate of the first portion is higher than a cyclization rate of the second portion.

\* \* \* \* \*